United States Patent [19]

Kresge

[11] Patent Number: 4,495,459
[45] Date of Patent: Jan. 22, 1985

[54] SURGE ARRESTER DISCHARGE COUNTING APPARATUS

[75] Inventor: James S. Kresge, Pittsfield, Mass.
[73] Assignee: General Electric Company, Pittsfield, Mass.
[21] Appl. No.: 420,195
[22] Filed: Sep. 20, 1982
[51] Int. Cl.³ ............................................ G01R 31/02
[52] U.S. Cl. ..................... 324/72; 324/106; 361/126; 361/127
[58] Field of Search ............... 324/72, 102, 104, 415, 324/106; 340/647, 650, 653, 659, 103, 105, 111, 118; 361/127, 128, 117, 126, 130, 131; 337/99, 101

[56] References Cited

U.S. PATENT DOCUMENTS

| | | | |
|---|---|---|---|
| 690,059 | 12/1901 | Isham, Jr. | 324/106 |
| 2,212,730 | 8/1940 | Downing, Jr. | 324/104 |
| 3,315,054 | 4/1967 | Langley | 337/99 |
| 4,338,648 | 7/1982 | Subbarao | 324/72 |

*Primary Examiner*—Michael J. Tokar
*Assistant Examiner*—Kevin D. O'Shea
*Attorney, Agent, or Firm*—Robert A. Cahill; William Freedman

[57] ABSTRACT

To record significant discharges of a surge arrester, the energy dissipated in a separate varistor element equivalent to the varistor elements in the arrester and connected in the arrester discharge path is monitored. When an arrester discharge results in a temperature increase above a predetermined minimum in the separate varistor element, heat sensing means thermally coupled therewith triggers a counter to record the event.

7 Claims, 2 Drawing Figures

SURGE ARRESTER DISCHARGE COUNTING APPARATUS

BACKGROUND OF THE INVENTION

The present invention relates to apparatus for counting the number of discharges through a voltage surge arrester and particularly to improved apparatus for counting only those surge arrester discharges having a significant effect on the arrester's useful life.

Typical surge arrester discharge counters respond to the flow of discharge current through the arrester and thus record each discharge event essentially without regard to the magnitude of the discharge energy. U.S. Pat. Nos. 3,443,223, 3,469,188, 4,112,418 and 4,338,648 exemplify this approach. Since the magnitude of the energy absorbed by the arrester incident with a surge discharge is the most significant debilitating factor insofar as arrester life is concerned, simply counting arrester discharges may not in many situations provide an accurate indication of an arrester's remaining useful life. That is, the discharge of a brief voltage spike having little associated energy will have negligible degrading effect on the varistor elements in the arrester, yet the discharge is counted when using the prior art discharge current sensing approach.

It is accordingly an object of the present invention to provide a more reliable approach to predicting the useful life span of a voltage surge arrester.

A further object of the present invention is to provide apparatus for counting only those surge arrester discharges exceeding a predetermined minimum energy content.

Another object is to provide surge arrester discharge counting apparatus of the above character which is convenient to implement and reliable in operation.

Other objects of the invention will in part be obvious and in part appear hereinafter.

SUMMARY OF THE INVENTION

In accordance with the present invention, there is provided apparatus for counting surge arrester discharges predicated on the magnitude of the energy associated with the discharges. That is, a count is registered only if the energy content of a discharge exceeds a predetermined minimum. To this end, a separate varistor element, such as a zinc oxide varistor, which is characteristic of the varistor elements in a surge arrester, is serially connected in the arrester discharge path. Consequently, this separate varistor element experiences the same prorated discharge energy as seen by the varistor elements in the arrester. To determine the magnitude of the discharge energy, temperature monitoring means is thermally coupled with the separate varistor element to sense the incremental heat rise induced therein by the discharge. The temperature monitoring means is operatively coupled to index a counter each time an arrester discharge produces a temperature rise in the varistor in excess of a predetermined minimum. To insure reliability, the temperature monitoring means is preferably ambient temperature compensated.

The present invention, accordingly comprises the features of construction, combination of elements, and arrangement of parts which will be exemplified in the construction hereinafter set forth, and the scope of the invention will be indicated in the claims.

For a fuller understanding of the nature and objects of the invention, references should be had to the following description taken in conjunction with the accompanying drawing, in which:

FIG. 1 is a schematic view of a surge arrester discharge counter apparatus constructed in accordance with the present invention; and FIG. 2 is a plan view of the temperature monitoring means utilized in the apparatus of FIG. 1.

Corresponding reference numerals refer to like parts throughout the several views of the drawing.

DETAILED DESCRIPTION

Figure 1:
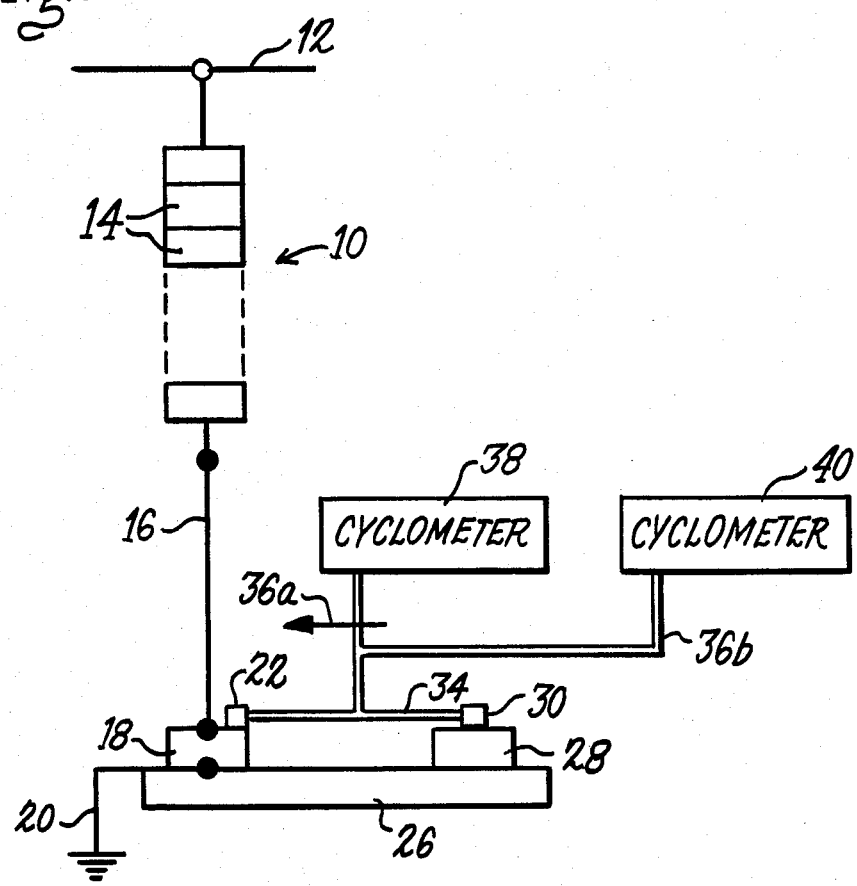

Referring to FIG. 1, reference numeral 10 refers generally to a voltage surge arrester for suppressing voltage surges induced on a transmission line 12 by lightning strikes, switching transients, etc. The arrester includes a serial stack of nonlinear resistance elements or varistors 14, such as metal oxide varistors; zinc oxide varistors being the most common. The number of varistor elements, normally of a disc-shape, utilized in an arrester stack is typically determined by the nominal voltage on the transmission line. The lower or ground terminal end of arrester 10 is connected by a cable 16 to one electrode of a separate varistor element 18 which is characteristic of the individual arrester varistor elements 14, e.g. same size and ratings. The opposite electrode of varistor 18 is connected via cable 20 to ground, and thus this varistor element is serially incorporated in the arrester discharge path.

Figure 2:
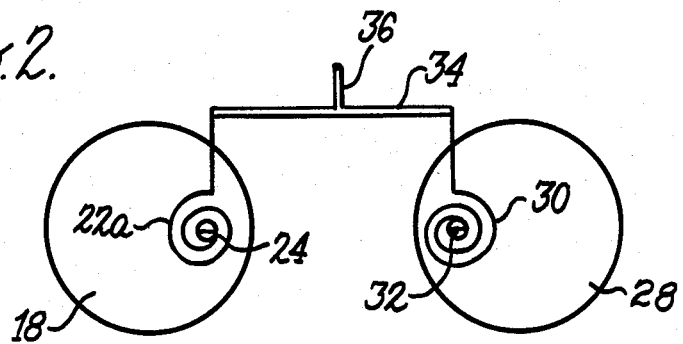

Mounted directly to or separately mounted in intimate thermally coupled relationship with varistor 18 is a temperature sensing device 22, which may take a variety of forms such as, for example, a coiled bimetallic strip 22a seen in FIG. 2. The inner end of this bimetallic strip is affixed to an anchor point, indicated at 24, from which it spirals outwardly in the clockwise direction. To provide ambient temperature compensation for the varistor temperature sensor, varistor 18 is mounted in heat coupled relation with a metal base plate 26. A metal disc 28 is then mounted in heat coupled relation with the base plate. A coiled bimetallic strip 30 is mounted in heat coupled relation with disc 28. The inner end of this bimetallic strip is anchored at point 32 and spirals outwardly in the counterclockwise direction. The outer ends of bimetallic strips 22a and 30 are affixed to opposite ends of a rigid tie rod 34 of thermally insulative material. At a point along the length of the tie rod there is affixed one end of an actuating rod 36 which extends to a counter 38 where it is poised to drive the incrementing mechanism thereof (not shown).

Assuming that the bimetallic strips are fabricated such that they tend to uncoil when heated, it is seen that when bimetallic strip 22a heats up, tie rod 34 and actuating rod 36 are pulled to the left, as indicated by arrow 36a. Since bimetallic strip 30 is coiled in the opposite direction as compared to strip 22a, when the two strips are heated up equally, such as under rising ambient temperature conditions, rods 34 and 36 remain essentially stationary. However, if bimetallic strip 22a is heated up independently of bimetallic strip 30, as when the temperature of varistor 18 is raised by virtue of having been subjected to an arrester discharge, rods 34 and 36 are indeed pulled leftward. The extent of this leftward movement is determined by the temperature rise experienced by bimetallic strip 22a, which is indicative of the temperature rise in varistor 18 and, correspondingly, the magnitude of the arrester of discharge energy dissipated therein. Whether or not to record a particular arrester discharge is determined by the extent of leftward movement of actuating rod 36 that is required to index cyclometer 38 one count. This can be established by the physical positioning of the actuating rod relative to the incrementing mechanism of the cyclometer. The sensitivity of the apparatus in terms of the relationship of incremental actuating rod movement to incremental varistor temperature rise may be adjusted by controlling the counteracting spring forces exerted on rod 34 by the bimetallic strips. This can be readily accomplished by correspondingly adjusting the tightness of their coiled configurations. Thus, if anchor point 24 for bimetallic strip 22a is turned in the counterclockwise direction and anchor point 32 for bimetallic strip 30 is turned a corresponding degree in the clockwise direction, the tension on rod 34 is increased. Consequently, the increment of varistor temperature rise necessary to produce the extent of actuating rod leftward movement required to index cyclometer 38 is increased.

It will be appreciated that once an arrester discharge is counted, the apparatus cannot register a subsequent arrester discharge until the temperatures of varistor 18 and disc 28 are essentially equalized by virtue of heat transfer through base plate 26 whereupon rods 34 and 36 are drawn back to their rightward neutral position. The duration of this resetting action depends on the degree of intimacy of the thermal coupling designed into the heat transfer system between varistor 18 and disc 28. If the reset duration is made relatively short, the apparatus will register count-qualifying arrester discharges closely spaced in time, but will not register a series of repetitive arrester discharges, which individually are not count-qualifying but have the net effect of producing an otherwise count-qualifying temperature rise in varistor 18. On the other hand, if the reset duration is made relatively long, the reverse of the above-noted circumstances will obtain.

If desired, actuating rod 36 may be provided with an extension 36b adapted to increment a second cyclometer 40, as seen in FIG. 1. This actuating rod extension is physically arranged with respect to the incrementing mechanism of this second cyclometer such as to require a greater extent of actuating rod leftward movement to register a count than is the case for cyclometer 38. Under these circumstances, cyclometer 38 would register all arrester discharges having an energy content above a first predetermined level, while cyclometer 40 would register only those arrester discharges having an energy content above a second, higher predetermined level. Thus, for example, cyclometer 38 could register all discharges resulting in an energy dissipation in varistor 18 and thus in the arrester varistor elements 14 in excess of 10% of their rated capacity, while cyclometer 40 could register only those discharges resulting in an energy dissipation in the varistor elements in excess of 20% of rated capacity.

It will be appreciated that, while the temperature sensors are shown as coiled bimetallic strips, they may take other forms having either mechanical or electrical responses to temperature change.

It is thus seen that the objects set forth above, as well as those made apparent from the preceding description, are efficiently attained, and, since certain changes may be made in the above construction without departing from the scope of the invention, it is intended that all matters contained in the above description or shown in the accompanying drawing shall be construed as illustrative and not in a limiting sense.

Having described my invention, what I claim as new and desire to secure by Letters Patent is:

1. Apparatus for counting discharges exceeding a predetermined minimum energy content of a surge arrester having a series stack of varistor elements, said apparatus including, in combination:
   A. a separate varistor element characteristic of the arrester varistor elements and serially connected in the arrester discharge path;
   B. a counter; and
   C. a varistor temperature sensing device thermally coupled with said separate varistor element and operatively coupled with said counter to initiate the registration of a count therein each time an arrester discharge produces a temperature rise in said separate varistor element in excess of a predetermined amount.

2. The apparatus defined in claim 1, wherein said separate varistor is a zinc oxide varistor.

3. The apparatus defined in claim 1, which further includes means providing ambient temperature compensation for said temperature sensing means.

4. The apparatus defined in claim 3, wherein said ambient temperature compensation means includes an ambient temperature sensing device situated in displaced relation to said varistor temperature sensing device and in predetermined heat transfer relation with said separate varistor element, said varistor and ambient temperature sensing devices being intercoupled such that the responses thereof to increasing ambient temperature are in counteraction.

5. The apparatus defined in claim 4, wherein said varistor and ambient temperature sensing devices are bimetallic elements mechanically coupled with each other and with said counter.

6. The apparatus defined in claims 4 or 5, which further includes a heat transfer system including a heat conductive plate thermally coupled with said separate varistor element and a heat conductive element thermally coupled with said plate, said ambient temperature sensing device being thermally coupled with said heat conductive element.

7. The apparatus defined in claims 1, 3 or 4, which further includes an additional counter operatively coupled with said varistor temperature sensing device such that a count is registered therein for each arrester discharge producing a temperature rise in said separate varistor element in excess of a predetermined greater amount than that required to actuate said first counter.

* * * * *